US010778201B1

United States Patent
Neidhardt et al.

(10) Patent No.: US 10,778,201 B1
(45) Date of Patent: Sep. 15, 2020

(54) SYSTEM AND METHOD OF CREATING PERIODIC PULSE SEQUENCES WITH DEFINED ABSOLUTE PHASE

(71) Applicant: Rohde & Schwarz GmbH & Co. KG, Munich (DE)

(72) Inventors: Steffen Neidhardt, Munich (DE); Matthias Ruengeler, Munich (DE); Jakob Hammer, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/402,843

(22) Filed: May 3, 2019

(51) Int. Cl.
*H03K 5/12* (2006.01)

(52) U.S. Cl.
CPC ................................. *H03K 5/12* (2013.01)

(58) Field of Classification Search
CPC ... H04J 3/0682; H04B 1/7085; H04B 1/7087; H04W 56/002; H04W 56/004; H04W 56/0045; H04W 56/005
See application file for complete search history.

(56) References Cited

U.S. PATENT DOCUMENTS

| 3,777,062 | A | * | 12/1973 | Ogawa | H04B 7/2125 370/215 |
| 4,346,407 | A | * | 8/1982 | Baer | H04N 5/067 345/213 |
| 5,125,100 | A | * | 6/1992 | Katznelson | H04H 20/78 348/724 |
| 5,751,193 | A | * | 5/1998 | Nakajima | H03L 7/26 331/3 |
| 5,789,988 | A | * | 8/1998 | Sasaki | H04L 27/38 329/304 |
| 5,952,834 | A | * | 9/1999 | Buckley | G01R 29/26 324/613 |
| 6,456,677 | B1 | * | 9/2002 | Hiramatsu | H04L 7/0054 375/354 |
| 8,781,051 | B2 | * | 7/2014 | Ciacci | H04L 7/0334 375/325 |
| 9,197,326 | B2 | * | 11/2015 | Anandarajah | H01S 5/0427 |
| 9,791,484 | B2 | * | 10/2017 | Pailloncy | G01R 25/00 |

OTHER PUBLICATIONS

"A reference signal for a dense frequency grid phase calibration", Liesbeth Gomme and Yves Rolain (1-4244-1541-1), IEEE International Instrumentation and Measurement Technology Conference; May 12-15, 2008.
"Optimization of a Next-Generation Comb Generator for Accurate Large-Signal Measurements on a User-Defined Frequency Grid", Pawel Barmuta, Frans Verbeyst, Arkadiusz Lewandowski, Dominique Schreurs (978-1-4799-3454-6); Apr. 2-4, 2014.

* cited by examiner

*Primary Examiner* — Thomas J Hiltunen
(74) *Attorney, Agent, or Firm* — Schwabe, Williamson & Wyatt, P.C.

(57) ABSTRACT

A system to create periodic pulse sequences with defined absolute phase comprises a phase coherent analyzer and a pulse generator. The phase coherent analyzer and the pulse generator are connected with each other. The pulse generator has a clock input connected to the analyzer for receiving a clock signal from the analyzer. The system comprises a trigger line via which a marker signal is provided to at least one of the analyzer and the pulse generator. The marker signal temporally aligns an output signal of the pulse generator with a measurement process of the analyzer. Further, a method of creating periodic pulse sequences with defined absolute phase is described.

19 Claims, 2 Drawing Sheets

SYSTEM AND METHOD OF CREATING PERIODIC PULSE SEQUENCES WITH DEFINED ABSOLUTE PHASE

TECHNICAL FIELD

Embodiments of the present disclosure relate generally to a system to create periodic pulse sequences with defined absolute phase. Further, embodiments of the present disclosure relate to a method of creating periodic pulse sequences with defined absolute phase.

BACKGROUND

In the state of the art, analyzer systems for testing a device under test are known, wherein the analyzer systems comprise phase coherent sources and receivers. The phase coherence is established by an internal analyzer marker signal that controls the timing, particularly the one of the sources and the receivers.

Further, an analyzer source provides a continuous wave input signal to a comb generator of the analyzer system, wherein the continuous wave input signal serves as a clock signal for the comb generator. The comb generator generates an output signal, wherein the spectrum of the output signal can be used for calibration of phase in frequency converting measurements such as mixer measurements, non-linear component characterization or rather U/I-waveform reconstruction.

Important figures of merit of the spectrum of the output signal relate to the signal to noise ratio of the comb lines as well as a fine frequency spacing within the spectrum. Accordingly, pseudo random binary sequences (PRBS) or frequency divider sequences are typically used that allow to effectively reduce the frequency spacing of the comb lines and, in case of pseudo random binary sequences used, to increase the signal to noise ratio of the comb lines. However, the spectrum of the output signal, namely the one of the periodic output sequence, has a phase ambiguity precluding the system to be used for absolute phase calibration.

Accordingly, there is a need for a system that permits absolute phase calibration.

SUMMARY

Embodiments of the present disclosure provide a system to create periodic pulse sequences with defined absolute phase. The system comprises a phase coherent analyzer and a pulse generator. The phase coherent analyzer and the pulse generator are connected with each other. The pulse generator has a clock input connected to the analyzer for receiving a clock signal from the analyzer. The system comprises a trigger line via which a marker signal is provided to the analyzer and/or the pulse generator. The marker signal temporally aligns an output signal of the pulse generator with a measurement process of the analyzer.

Further, embodiments of the present disclosure provide a method of creating periodic pulse sequences with defined absolute phase, with the following steps:
establishing a connection between an analyzer and a pulse generator,
providing a clock signal from the analyzer to the pulse generator,
establishing a trigger line to at least one of the analyzer and the pulse generator, and
providing a marker signal that temporally aligns an output signal of the pulse generator with a measurement process of the analyzer.

Accordingly, the pulse generator, particularly a periodic output sequence or rather the output signal of the pulse generator, is synchronized with the analyzer in time, namely the internal measurement process of the analyzer. The internal measurement process may relate to an internal measurement protocol that is used by the analyzer for analyzing/measurement purposes. The synchronization of the analyzer and the pulse generator ensures that a phase ambiguity is overcome.

Hence, the pulse generator, particularly its operation, and the analyzer are synchronized with each other in time due to the marker signal. Put another way, the marker signal temporally aligns the output signal of the pulse generator with the measurement process of the analyzer.

Due to the synchronization of the pulse generator with the phase coherent analyzer, a coherent system is provided that is configured to create periodic pulse sequences with defined absolute phase. Therefore, the system can be used for absolute phase calibration.

In other words, it is avoided that the output signal, namely the periodic output sequence, of the pulse generator is not temporally aligned with the measurement process of the analyzer, which might yield in an ambiguous phase of the spectrum of the output signal.

Accordingly, the synchronization of the pulse generator and the analyzer ensures that the phase ambiguity of the spectrum of the pulse generator can be eliminated.

In general, the marker signal that temporally aligns the output signal of the pulse generator with the analyzer, namely the measurement process of the analyzer, may correspond to an electrical pulse. For instance, the electrical pulse relates to a direct alignment, namely an instantaneous alignment, an alignment with a predefined delay or rather an alignment that depends on the clock signal. For instance, the marker signal may relate to a next skirt of the clock signal or the one after the next one.

Generally, the position of the skirt(s) of the clock signal, also called clock skirt(s), is shifted by noise or rather jitter.

Hence, the position of the edge(s) may also be influenced by noise or rather jitter.

The clock signal may have a specific frequency. The clock signal may relate to a radio frequency signal (RF signal) that is output by the analyzer.

According to an aspect, the pulse generator has a periodic sequence that defines on which cycles of the clock signal the pulse generator generates a pulse. For instance, a pulse is not generated for every falling edge of the clock signal, but every second falling edge (divider mode with N=2).

Particularly, the periodic sequence is either pre-set or configurable by a user. Hence, a manufacturer of the system may pre-set a certain periodic sequence that corresponds to a default setting of the system, particularly the pulse generator. Alternatively or additionally, a user may configure the periodic sequence according to his individual preferences. The user may be enabled to overwrite the default setting, namely the pre-set periodic sequence. However, the right to overwrite the default setting may be assigned to an administrator or rather a super-user that has to login previously.

Generally, the periodic sequence may relate to a divider mode, a pseudo random binary sequence (PRBS) mode, or a custom periodic sequence mode. The respective mode depends inter alia on the type of pulse generator used by the system. Thus, the user may set a custom periodic sequence according to his individual preferences. Particularly, the periodic sequence relating to the divider mode or rather the PRBS mode may be adapted by the user individually.

According to an embodiment, the marker signal is an analyzer marker signal issued from the analyzer. The analyzer marker signal typically synchronizes at least one measurement process of the analyzer internally. Hence, the analyzer marker signal may correspond to an electrical pulse that is used by the analyzer for synchronizing internal measurements according to a certain measurement protocol. This electrical pulse can also be used for synchronizing the analyzer and the pulse generator with each other (time alignment) while forwarding the analyzer marker signal to the pulse generator.

In other words, the internal signal processing of the analyzer is temporally aligned by using analyzer marker signals, for instance short electrical pulses, that define the starts and stops of partial measurements done by the analyzer. This analyzer marker signal may also be used to synchronize the pulse generator with the analyzer such that the analyzer and the pulse generator are temporally aligned with each other.

Another aspect provides that the pulse generator is configured to receive the marker signal and compare the marker signal to the clock signal. Hence, the pulse generator receives the marker signal and the pulse generator compares the marker signal to the clock signal. The marker signal may correspond to the analyzer marker signal issued by the analyzer. The analyzer and the pulse generator are temporally aligned, as the marker signal received by the pulse generator is compared to the clock signal that is also received by the pulse generator.

In other words, the (analyzer) marker signal, which relates to an input signal for the pulse generator, is introduced to reset the starting point of the output signal of the pulse generator, namely the periodic output sequence. This allows synchronization of the pulse generator with the analyzer. Hence, synchronicity between the analyzer and the pulse generator is established by feeding the analyzer marker signal, which typically triggers the start and stop of the partial measurement of the analyzer to a trigger interface of the pulse generator, while using the analyzer marker signal to reset the start of the output sequence of the pulse generator. Accordingly, a phase ambiguity of the spectrum of the output signal of the pulse generator can be eliminated effectively.

Particularly, the marker signal received is compared to the time of edges in the clock signal or rather the time of skirt of the clock signal.

Generally, the respective temporal alignment may be done once.

The marker signal received may be shifted between the skirts or rather edges of the clock signal to avoid jitter creating a phase ambiguity that would occur when the marker signal is received on a skirt or rather an edge of the clock signal. This might happen, as the marker signal could be jittered right before or right after the skirt or rather the edge.

According to another embodiment, the marker signal corresponds to a trigger signal issued from the pulse generator. The trigger signal may indicate a reset, namely a beginning, of a periodic sequence of the pulse generator. Thus, the trigger signal is forwarded from the pulse generator to the analyzer in order to synchronize the analyzer, particularly an internal measurement process, and the pulse generator (alignment in time). Put another way, the trigger signal issued from the pulse generator may be used by the analyzer to synchronize the internal measurement process that is typically done by the analyzer marker signal.

Particularly, the analyzer is configured to receive the marker signal from the pulse generator. The marker signal received by the analyzer corresponds to the trigger signal issued by the pulse generator.

Hence, the analyzer may be temporally aligned in post-processing with the pulse generator. This means that the measurement results may be post-processed by the analyzer in an appropriate manner.

Another aspect provides that the marker signal is provided by an external device. The external device may provide the marker signal to the analyzer or rather the pulse generator. The respective component receiving the marker signal from the external device, namely the analyzer or rather the pulse generator, may forward the marker signal to the other component of the system, namely the pulse generator or rather the analyzer.

Alternatively, the marker signal provided by the external device may be forwarded to the analyzer and the pulse generator simultaneously in order to synchronize the analyzer and the pulse generator.

The external device may be a computer, a signal generator or any other device configured to issue a trigger signal.

Generally, the pulse generator may be a comb generator. Thus, the pulse generator is a signal generator that typically produces multiple harmonics of a signal received.

According to an aspect, the pulse generator and the analyzer are integrated in a common device. The common device may relate to a vector network analyzer or rather a spectrum analyzer, wherein the common device simultaneously encompasses the pulse generator, for instance the comb generator, and the analyzer, namely the module having the respective analyzing function.

As the pulse generator and the analyzer are integrated in the common device, the synchronization may be done internally such that the absolute phase calibration can be done automatically in a self-calibration mode of the common device.

Accordingly, a synchronized pulse generator for arbitrary periodic output sequences is provided, as the output signal, namely the periodic output sequence, is reset at a well-defined time with respect to a radio frequency input signal, namely the clock signal received.

Alternatively, the internal measurement process of the analyzer is synchronized with the periodic sequence of the pulse generator, which also results in a phase coherent system that can be employed for absolute phase calibration.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
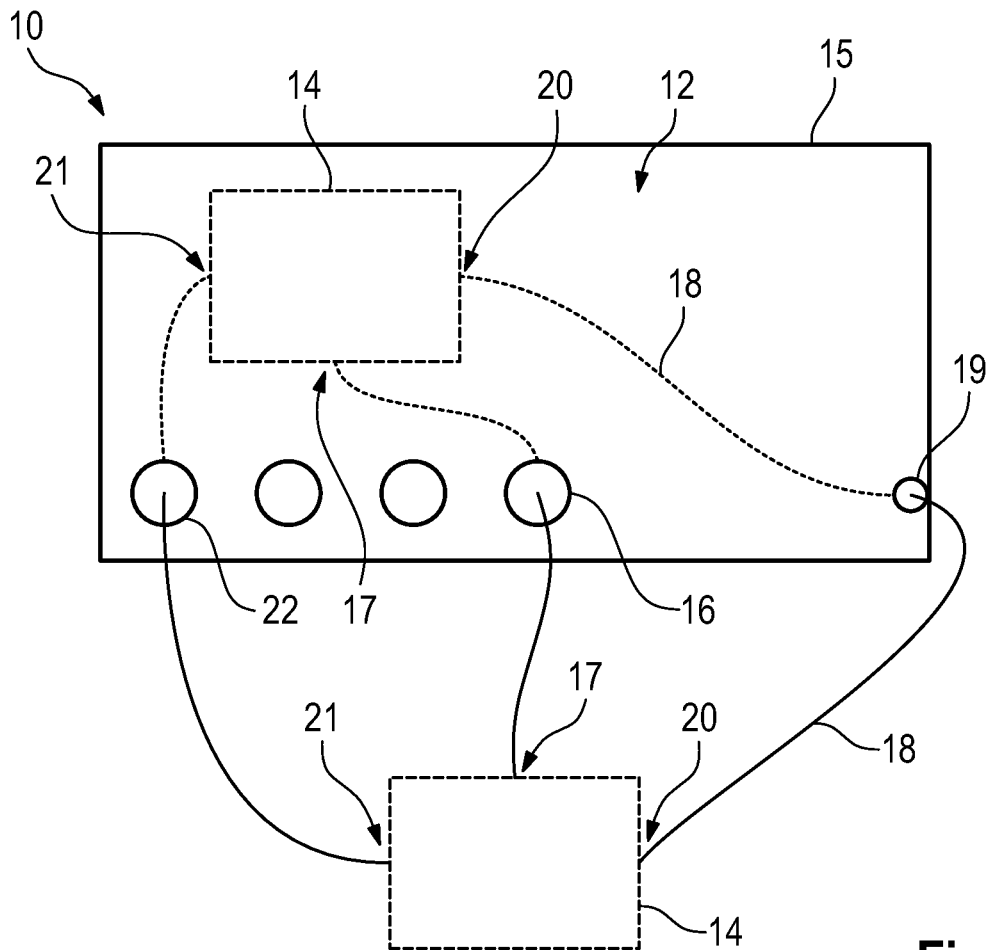
FIG. 1 schematically shows a system according to an embodiment of the present disclosure.

In FIG. 1, a system 10 is shown that comprises an analyzer 12 and a pulse generator 14 that are connected with each other.

The analyzer 12 and the pulse generator 14 may be integrated in a common device 15 or rather formed separately. Both alternatives are illustrated in FIG. 1, as both positions of the pulse generator 14 are illustrated by dashed lines.

The analyzer 12 has a signal output 16, for instance a radio frequency output, via which a radio frequency signal such as a continuous wave signal is output, which is forwarded to the pulse generator 14. The respective signal is received by the pulse generator 14 while being used as a clock signal. Hence, the pulse generator 14 has a clock input 17 that is connected to the signal output 16 of the analyzer 12.

Further, the pulse generator 14 is connected to the analyzer 12 by a trigger line 18 via which a marker signal is exchanged between the analyzer 12 and the pulse generator 14. Hence, the analyzer 12 as well as the pulse generator 14 each have a respective trigger interface 19, 20 via which the analyzer 12 and the pulse generator 14 are also interconnected with each other.

Accordingly, the trigger line 18 is part of the system 10, wherein the trigger line 18 is used to transmit the marker signal as will be described later in more detail.

In addition, the pulse generator 14 has an output 21 via which an output signal is issued that is forwarded to an input 22 of the analyzer 12. The output signal of the pulse generator 14 corresponds to a periodic output sequence.

Hence, the pulse generator 14 has a periodic sequence that defines on which cycles of the clock signal received the pulse generator 14 generates a pulse. This is inter alia shown in FIG. 2 illustrating the radio frequency input signal (RF input signal) as well as the resulting clock signal.

Generally, the periodic sequence of the pulse generator 14 may be assigned to a divider mode, a pseudo random binary sequence mode or a custom periodic sequence mode. In the example shown in FIG. 2, the periodic sequence relates to a divider mode (N=2). In fact, the frequency spacing of the pulses is given by half of the frequency of the clock signal.

Figure 2:
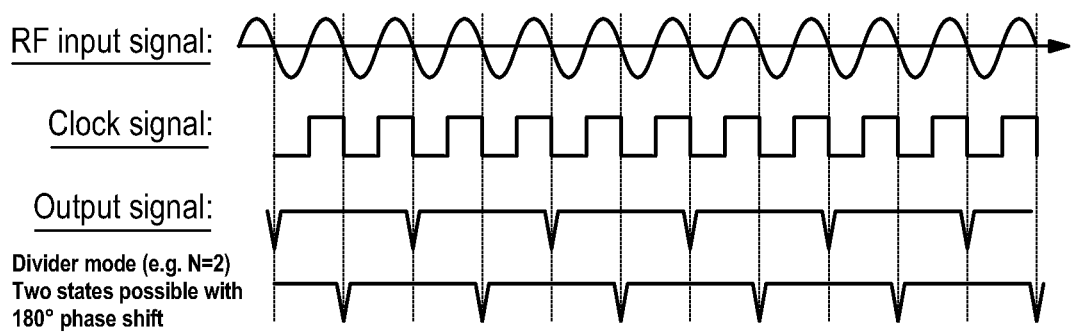
FIG. 2 shows an overview illustrating signals over time without temporal alignment.

As shown in FIG. 2, the output signal of the pulse generator 14, namely the periodic output sequence, may have two possible states with 180° phase shift. Hence, a 180° phase shift between the measured spectra of both divider output signals occur depending on the respective starting point of the periodic sequence of the pulse generator 14. This is also called phase ambiguity.

Accordingly, absolute phase calibration is not possible due to the phase ambiguity.

In order to overcome this drawback, the marker signal exchanged via the trigger line 18 is used that synchronizes the pulse generator 14 with the analyzer 12 in time (temporal alignment).

In other words, the output signal of the pulse generator 14 is temporally aligned with an internal measurement process of the analyzer 12.

Accordingly, an absolute phase calibration can be employed by the system 10, as a phase ambiguity in the spectrum of the output signal of the pulse generator 12 is eliminated due to the marker signal exchanged.

Thus, the system 10 is configured to create periodic pulses, namely the output signal of the pulse generator 14, with defined absolute phase. In other words, a coherent system 10 is provided.

According to a first embodiment, an analyzer marker signal provided by the analyzer 12 is forwarded via the trigger line 18 from the analyzer 12 to the pulse generator 14, which serves as the marker signal. The analyzer marker signal temporally aligns the pulse generator 14 with the analyzer 12.

In fact, the output signal, particularly the periodic output sequences, of the pulse generator 14 is synchronized with a measurement protocol of the analyzer 12, as the analyzer marker signal is typically used to internally synchronize the measurement processes of the analyzer 12.

Put another way, the analyzer marker signal is typically used to trigger the start and stop of partial measurements of the analyzer 12 internally.

Figure 3:
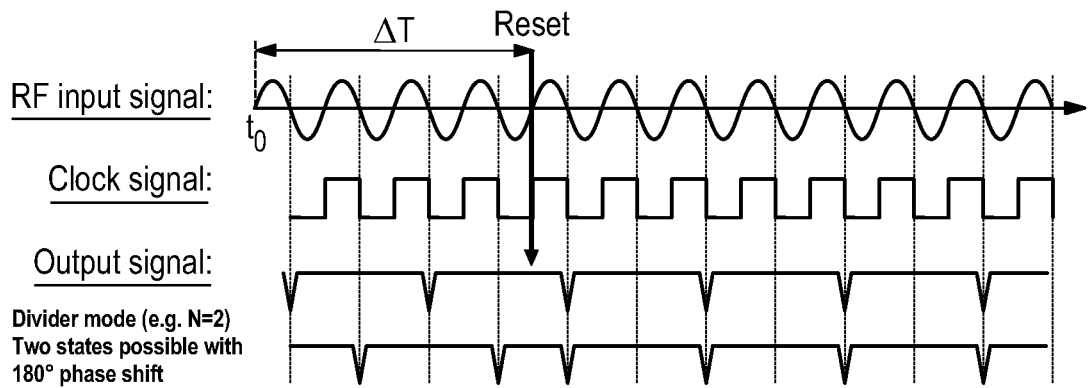
FIG. 3 shows the overview of FIG. 2 with temporal alignment, and FIG. 4 schematically shows another embodiment of a system according to the present disclosure.

Hence, synchronicity between the analyzer 12 and the pulse generator 14 is established by feeding the analyzer marker signal to the pulse generator 14, which triggers the start and stop of the partial measurement(s) of the analyzer 12. The analyzer marker signal is used to reset the start of the output signal of the pulse generator 14 as shown in FIG. 3. Hence, the output signal of the pulse generator 14 is reset after a certain period of time indicated by ΔT.

This way, the phase ambiguity of the spectrum of the pulse generator 14 can be eliminated, which becomes obvious when comparing the overviews shown in FIGS. 2 and 3.

Accordingly, an input trigger for the pulse generator 14 is introduced via the trigger line 18. The input trigger is received by the pulse generator 14 in order to reset the starting point of the periodic (output) sequence of the pulse generator 14.

Generally, the marker signal established by the analyzer marker signal allows synchronization of the pulse generator 14 with the analyzer 12 in order to temporally align the pulse generator 14 with the analyzer 12, particularly the start of the partial measurement process done by the analyzer 12.

In contrast, as mentioned above, if the start of the output sequence of the pulse generator 14 is not temporally aligned with the analyzer 12, the phase of the spectrum of the output signal of the pulse generator 14 is ambiguous in a divider mode or rather pseudo random binary sequence mode as shown in FIG. 2.

In the example shown in FIG. 2, the output sequence of the pulse generator 14 is half the frequency of the radio frequency signal used as the clock signal while providing a clock frequency for the pulse generator 14. Depending on the temporal start of the output sequence of the pulse generator 14 with respect to the clock signal, there are two possible states with a phase shift of 180°. This is generally known as phase ambiguity.

In order to avoid this phase ambiguity shown in FIG. 2, the marker signal, namely a short electrical pulse, is used to synchronize the analyzer 12 and the pulse generator 14.

The pulse generator 14 that receives the marker signal, particularly the analyzer marker signal, is configured to compare the marker signal received to the clock signal received, particularly to time of edges or rather skirts of the clock signal.

In another embodiment, the marker signal may also correspond to a trigger signal that is issued by the pulse generator 14.

Thus, the marker signal is provided by the pulse generator 14 and forwarded to the analyzer 12 for temporally aligning the analyzer 12 and the pulse generator 14. Hence, the analyzer 12 is configured to receive the trigger signal in order to synchronize its internal measurement process appropriately.

The trigger signal may indicate a reset, namely a beginning, of a periodic sequence of the pulse generator 14, which is used to synchronize the internal measurement process(es) of the analyzer 12 in order to temporally align the analyzer 12 and the pulse generator 14.

For instance, the analyzer 12 is temporally aligned in post-processing.

Figure 4:
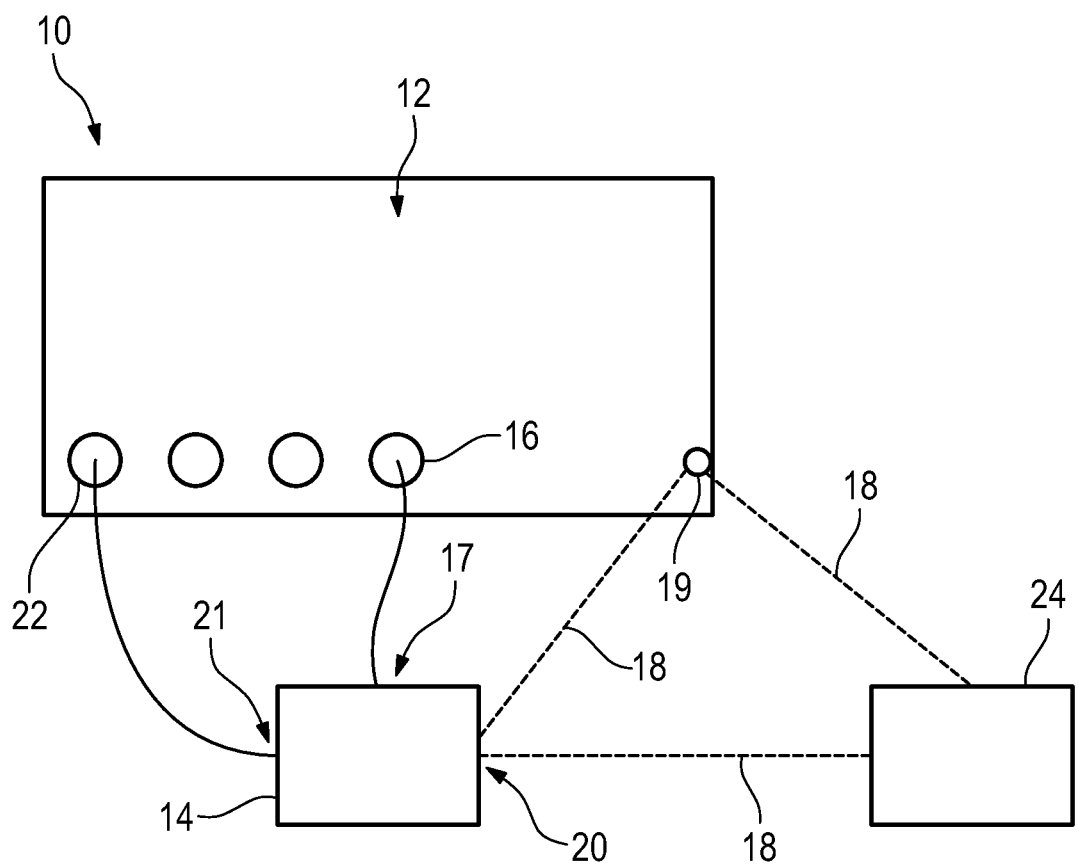

In an alternative embodiment shown in FIG. 4, the marker signal is provided by an external device 24. The external device 24 may input the marker signal to the analyzer 12 and/or the pulse generator 14.

The analyzer 12 or rather the pulse generator 14 may forward the marker signal received from the external device 24 to the other component of the system 10 in order to establish a further trigger line 18 between the analyzer 12 and the pulse generator 14.

For instance, the external device 24 issues the marker signal that is forwarded to the analyzer 12 which in turn forwards the maker signal to the pulse generator 14.

Alternatively, the external device 24 issues the marker signal that is forwarded to the pulse generator 14 which in turn forwards the maker signal to the analyzer 12.

In another alternative, the external device 24 forwards the marker signal to the analyzer 12 and the pulse generator 14 simultaneously in order to synchronize both components of the system 10 without any (direct) interaction between the analyzer 12 and the pulse generator 14 for temporal alignment purposes.

These different alternatives are all indicated in FIG. 4, as the respective trigger lines 18 established between the analyzer 12, the pulse generator 14 and the external device 24 are illustrated by dashed lines.

As described with reference to FIG. 1, the pulse generator 14 and the analyzer 12 may also be housed in a common device such that they are encompassed by a common housing.

Generally, the pulse generator 14 may be established by a comb generator. The analyzer 12 may be a vector network analyzer or rather a spectrum analyzer.

As mentioned above, the pulse generator 14 has a periodic sequence that defines on which cycles of the clock signal received, the pulse generator 14 generates a pulse. Hence, the pulse generator 14 does not necessarily have to generate a pulse on every edge provided by the clock signal.

The periodic sequence used may be pre-set and/or configurable by a user of the system 10. Thus, a default value for the periodic sequence may be set. However, the default value can be used or rather overwritten by a user if desired. Thus, the periodic sequence may relate to a divider sequence (divider mode), a pseudo random binary sequence (PRBS mode) or a custom periodic sequence (custom periodic mode).

In general, the system 10 ensures that a pulse generator 14 for arbitrary periodic output sequences is provided, which is synchronized in time with the analyzer 12. In fact, the periodic output sequence of the pulse generator 14 is reset at a well-defined time with respect to the radio frequency input signal, namely the clock signal received. This allows to resolve any phase ambiguity of the output signal, namely the periodic output sequence. Hence, periodic output sequences can be used in a coherent manner. Thus, an absolute phase calibration can be employed by the system 10 due to the trigger line 18 established in the system 10 that temporally aligns the analyzer 12 and the pulse generator 14.

The invention claimed is:

1. A system to create periodic pulse sequences with defined absolute phase, the system comprising a phase coherent analyzer and a pulse generator, the phase coherent analyzer and the pulse generator being connected with each other, the pulse generator having a clock input connected to the analyzer for receiving a clock signal from the analyzer, the system comprising a trigger line via which a marker signal is provided to at least one of the analyzer and the pulse generator, the marker signal temporally aligning an output signal of the pulse generator with a measurement process of the analyzer such that the system is a coherent one that is configured to create periodic pulse sequences with defined absolute phase.

2. The system according to claim 1, wherein the pulse generator has a periodic sequence that defines on which cycles of the clock signal the pulse generator generates a pulse.

3. The system according to claim 2, wherein the periodic sequence is either pre-set or configurable by a user.

4. The system according to claim 2, wherein the periodic sequence relates to a divider mode, a pseudo random binary sequence mode or a custom periodic sequence mode.

5. The system according to claim 1, wherein the marker signal is an analyzer marker signal issued from the analyzer, the analyzer marker signal internally synchronizing at least one measurement process of the analyzer.

6. The system according to claim 1, wherein the pulse generator is configured to receive the marker signal and to compare the marker signal to the clock signal.

7. The system according to claim 1, wherein the marker signal corresponds to a trigger signal issued from the pulse generator.

8. The system according to claim 1, wherein the analyzer is configured to receive the marker signal from the pulse generator.

9. The system according to claim 1, wherein the marker signal is provided by an external device.

10. The system according to claim 1, wherein the pulse generator is a comb generator.

11. The system according to claim 1, wherein the pulse generator and the analyzer are integrated in a common device.

12. A method of creating periodic pulse sequences with defined absolute phase, with the following steps:
   Establishing a connection between an analyzer and a pulse generator,
   Providing a clock signal from the analyzer to the pulse generator,
   Establishing a trigger line to at least one of the analyzer and the pulse generator, and
   Providing a marker signal that temporally aligns an output signal of the pulse generator with a measurement process of the analyzer in order to create periodic pulse sequences with defined absolute phase.

13. The method according to claim 12, wherein the pulse generator receives the marker signal and the pulse generator compares the marker signal to the clock signal.

14. The method according to claim 12, wherein the marker signal is an analyzer marker signal issued from the analyzer, the analyzer marker signal internally synchronizing at least one measurement process of the analyzer.

15. The method according to claim 12, wherein the marker signal corresponds to a trigger signal issued from the pulse generator.

16. The method according to claim 12, wherein the analyzer receives the marker signal from the pulse generator.

17. The method according to claim 12, wherein the analyzer is temporally aligned in post-processing.

18. The method according to claim 12, wherein the marker signal is provided by an external device.

19. A system to create periodic pulse sequences with defined absolute phase, the system comprising a phase coherent analyzer and a pulse generator, the phase coherent analyzer and the pulse generator being connected with each other, the pulse generator having a clock input connected to the analyzer for receiving a clock signal from the analyzer, the system comprising a trigger line via which a marker signal is provided to at least one of the analyzer and the pulse generator, the marker signal temporally aligning an output signal of the pulse generator with a measurement process of the analyzer, and wherein the marker signal corresponds to an electrical pulse that relates to a direct alignment, an alignment with a predefined delay or rather an alignment that depends on the clock signal.

\* \* \* \* \*